(12) United States Patent
Kang et al.

(10) Patent No.: US 7,554,349 B2
(45) Date of Patent: Jun. 30, 2009

(54) HANDLERS FOR TESTING SEMICONDUCTOR DEVICES THAT ARE CAPABLE OF MAINTAINING STABLE TEMPERATURE IN TEST ENVIRONMENTS

(75) Inventors: Seong-goo Kang, Cheonan-si (KR); Jun-ho Lee, Yongin-si (KR); Ki-sang Kang, Yongin-si (KR); Hyun-seop Shim, Incheon (KR); Do-young Kam, Suwon-si (KR); Jae-il Lee, Yongin-si (KR); Ju-il Kang, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/727,938

(22) Filed: Mar. 29, 2007

(65) Prior Publication Data
US 2007/0236235 A1    Oct. 11, 2007

(30) Foreign Application Priority Data
Apr. 11, 2006    (KR)    ........... 10-2006-0032743

(51) Int. Cl.
*G01R 31/02*    (2006.01)
(52) U.S. Cl. .................................. 324/760
(58) Field of Classification Search ............ None
See application file for complete search history.

(56) References Cited

U.S. PATENT DOCUMENTS 4,926,118 A * 5/1990 O'Connor et al. ........... 324/760
5,307,011 A * 4/1994 Tani ..................... 324/158.1
5,319,353 A * 6/1994 Ohnishi et al. ............. 340/525
5,788,084 A * 8/1998 Onishi et al. ............. 324/158.1
6,078,188 A * 6/2000 Bannai et al. ............... 324/765

(Continued)

FOREIGN PATENT DOCUMENTS

JP    07-020199    1/1995

(Continued)

OTHER PUBLICATIONS

Office Action dated Apr. 4, 2007 for corresponding Korean Application No. 10-2006-0032743.

*Primary Examiner*—Jermele M Hollington
(74) *Attorney, Agent, or Firm*—Harness, Dickey & Pierce, P.L.C.

(57) ABSTRACT

A semiconductor device test handler for maintaining stable temperature in a test environment may include a loading unit that loads a plurality of semiconductor devices mounted on a test tray; a soak chamber configured to receive the test tray from the loading unit and to age the semiconductor devices at an aging temperature; and a test chamber configured to receive and test the aged semiconductor devices. The test chamber may include: a test board; a first chamber; a second chamber; one or more pipelines connected to the first and second chambers that allow a temperature-control medium to flow between the first and second chambers; a de-soak chamber that further ages the tested semiconductor devices so that the tested semiconductor devices substantially return to ambient temperature; and a sorting and unloading unit that sorts the tested semiconductor devices according to results of the test and that unloads the sorted semiconductor devices.

24 Claims, 8 Drawing Sheets

U.S. PATENT DOCUMENTS

| | | |
|---|---|---|
| 6,518,745 B2 * | 2/2003 | Kim et al. ................. 324/158.1 |
| 6,728,652 B1 * | 4/2004 | Kobayashi ................... 702/117 |
| 6,765,378 B2 * | 7/2004 | Seng et al. ............... 324/158.1 |
| 6,844,717 B2 * | 1/2005 | Shim et al. ............... 324/158.1 |
| 2005/0012498 A1 * | 1/2005 | Lee et al. ................. 324/158.1 |
| 2007/0182437 A1 * | 8/2007 | Shim et al. ................. 324/765 |
| 2008/0042667 A1 * | 2/2008 | Yamashita et al. .......... 324/754 |

FOREIGN PATENT DOCUMENTS

| | | |
|---|---|---|
| KR | 10-2000-0035699 | 6/2000 |
| KR | 2003-0063407 | 7/2003 |
| KR | 1020050001809 A | 1/2005 |
| KR | 1020050008227 A | 1/2005 |

* cited by examiner

HANDLERS FOR TESTING SEMICONDUCTOR DEVICES THAT ARE CAPABLE OF MAINTAINING STABLE TEMPERATURE IN TEST ENVIRONMENTS

PRIORITY STATEMENT

This application claims priority from Korean Patent Application No. 10-2006-0032743, filed on Apr. 11, 2006, in the Korean Intellectual Property Office (KIPO), the entire contents of which are incorporated herein by reference.

BACKGROUND

1. Field

Example embodiments relate to electrical test apparatuses for semiconductor devices. Also, example embodiments relate to handlers (i.e., test robots) that electrically connect semiconductor devices to testers and automatically perform loading, testing, sorting, and/or unloading operations on the semiconductor devices.

2. Description of Related Art

A handler used for an electrical test of a semiconductor device is a kind of automatic test robot loading a semiconductor device, automatically performing an electrical test by electrically connecting the loaded semiconductor device to a tester, sorting semiconductor devices according to the results of the electrical test, and unloading sorted semiconductor devices to the outside.

Recently, large-capacity and high-speed semiconductor memory devices have been developed. Accordingly, the time it takes to electrically test a completed large capacity and high-speed semiconductor memory device has also increased. Thus, increasing test efficiency during an electrical test process of a semiconductor memory device is very important.

Therefore, a tester and a handler, which are test apparatuses for semiconductor memory devices, are developing with focus on realization of a test apparatus that can increase test efficiency. A means of reducing testing time among these tester and handler developments may be generally found by the following methods.

First, it is possible to reduce testing time by changing a test method and reducing a test program. Second, it is possible to reduce testing time by increasing the number of semiconductor memory devices tested at a time, that is, the number of devices under test (DUTs), such as semiconductor devices during a parallel test. However, it is difficult to increase the number of semiconductor memory devices when the increase is applied to the handler as well as to the tester.

Generally, a handler used for a parallel test of semiconductor devices includes a loading unit loading a plurality of semiconductor devices contained in a tray unit; a soak chamber receiving a test tray from the loading unit and aging the test tray at a predetermined temperature for a predetermined time; a test chamber receiving the test tray from the soak chamber, connecting the received test tray directly to the tester, and performing an electrical test on the semiconductor devices loaded into the test tray; a de-soak chamber aging an electrical test-completed semiconductor device at an atmospheric temperature for a predetermined time; and a sorting/unloading unit sorting the tested semiconductor devices and unloading the sorted semiconductor devices according to the test results obtained in the test chamber.

A conventional handler generally uses an air-cooled temperature controller apparatus in order to maintain a constant inner temperature of a test chamber when an electrical test of a semiconductor device is performed at a high or low temperature.

The conventional handler for the semiconductor device cannot maintain a constant inner temperature of a test chamber when the number of semiconductor devices tested inside the test chamber during a parallel test increases. Also, a temperature difference is generated more or less depending on an inner position of the test chamber. To solve this problem, a variety of methods have been proposed to control temperature by controlling an air circulation fan's position and direction, an amount of airflow of a fan, heat generation from a heater, and change of a temperature sensor's position.

However, as high-speed semiconductor devices develop, more heat is generated from the semiconductor devices themselves during an electrical test. Also, as the number of semiconductor devices tested at a time exceeds 256, the whole heat generated in a test chamber increases. Accordingly, temperature control using the conventional methods has reached its limits, and there is a need for new means of temperature control.

SUMMARY

Example embodiments provide semiconductor device test handlers that may maintain a stable temperature or temperatures in a test environment by, for example, partitioning a test chamber into two or more test spaces, installing first and/or second chambers for temperature control in each of the partitioned test spaces, and/or performing a temperature control operation on the test chambers using a temperature-control medium.

According to example embodiments, semiconductor device test handlers capable of maintaining stable temperatures in test environments may include: a loading unit that loads a plurality of semiconductor devices mounted on a test tray; a soak chamber configured to receive the test tray from the loading unit and age the semiconductor devices at a predetermined temperature; and/or a test chamber configured to receive and test the aged semiconductor devices. The test chamber may include: a test board; a first chamber disposed near the test board; a second chamber disposed near the first chamber; one or more pipelines connected to the first and second chambers that allow a temperature-control medium to flow between the first and second chambers; a de-soak chamber that further ages the tested semiconductor devices so that the tested semiconductor devices substantially return to ambient temperature; and/or a sorting/unloading unit that sorts the tested semiconductor devices according to results of the tests and that unloads the sorted semiconductor devices.

The test chamber may further include a pressing unit configured to press the semiconductor devices in order to electrically connect the semiconductor devices to the test board. The test chamber may include two or more pressing units. The two or more pressing units may include a measuring unit that measures a sum of forces applied by the two or more pressing units. The test chamber may include at least one pair of pressing units.

The one or more pipelines may include: a first pipeline that supplies the temperature-control medium from the second chamber to a contact drive plate near the first chamber; and/or a second pipeline that returns the temperature-control medium from the contact drive plate to the second chamber.

The flow of the temperature-control medium through the first and second pipelines may be generated by a natural convection phenomenon due to a temperature difference in the temperature-control medium. The temperature control medium may include liquid coolant. The liquid coolant may include ethanol.

The first chamber in the test chamber may include: a contact drive plate pressed by the pressing unit; a thermoelectric plate disposed near the contact drive plate; a thermoelectric pad disposed near the thermoelectric plate; a match plate disposed near the thermoelectric pad; and/or semiconductor packages mounted on the test board. The match plate may include a plurality of heat dissipation units. The semiconductor packages may contact the heat dissipation units.

The thermoelectric plate may be formed of material exhibiting the Peltier effect. The thermoelectric pad may be formed of material that has high thermal conductivity and that absorbs contact pressure generated when the semiconductor packages are brought into contact with the heat dissipation units. The thermoelectric pad may be formed of one or more of thermal conductive silicon paste, heatsink grease, and thermal conductive compound. The heat dissipation units may be formed of one or more metals with high thermal dissipation efficiency. The one or more metals may include aluminum.

The second chamber may include a heat sink that may dissipate heat to an outside environment.

The test chamber may include at least two test spaces where the semiconductor devices may be tested on the test tray or trays. The at least two test spaces may be created by one or more barriers formed of one or more thermal insulators.

The de-soak chamber may be disposed above or below the soak chamber (i.e., in the same direction as the soak chamber) to minimize a temperature variation that may be generated in the test chamber while the test-completed test tray is moved or test trays are moved.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
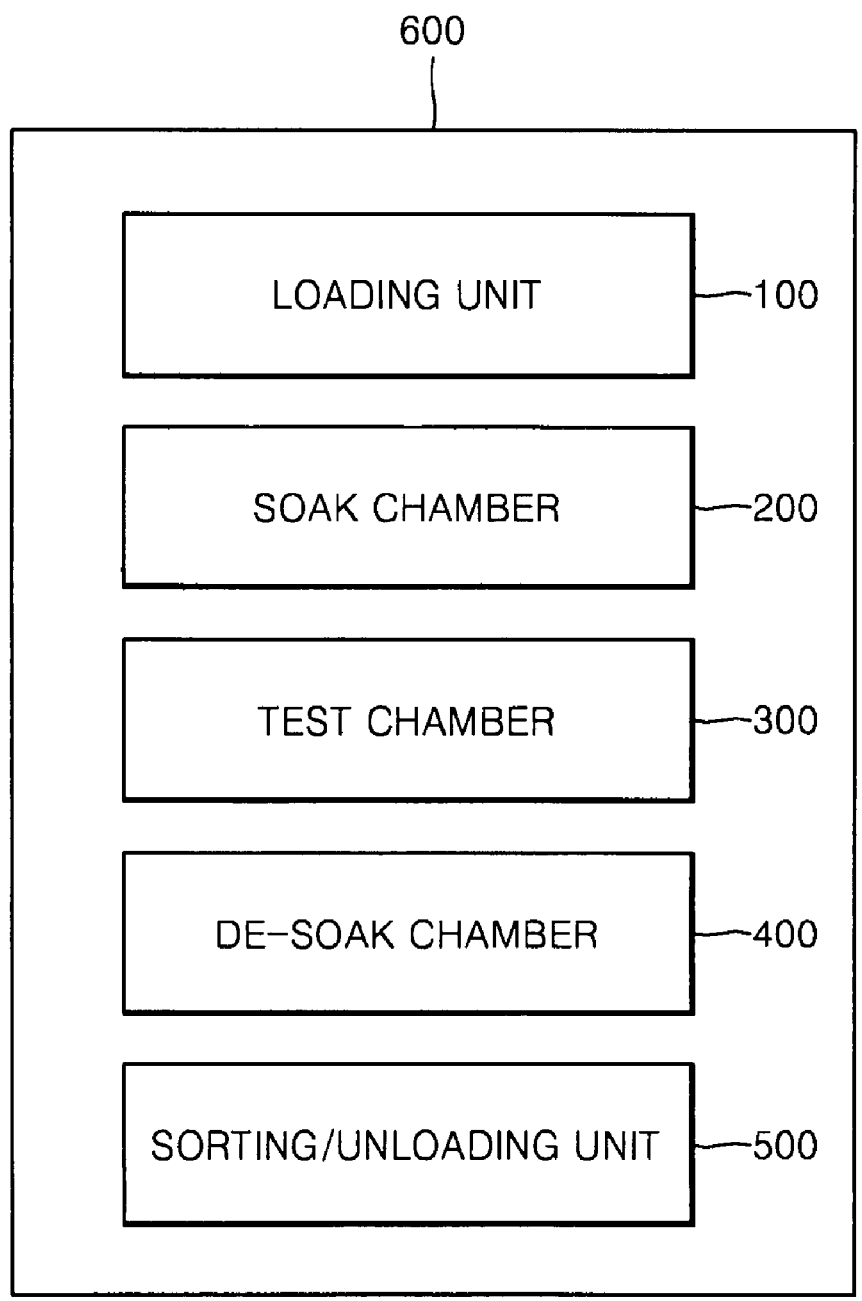
FIG. 1 is a block diagram of a semiconductor device test handler according to an example embodiment.

Example embodiments will now be described more fully with reference to the accompanying drawings. Embodiments, however, may be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to," or "coupled to" another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, such as "beneath," "below," "lower," "above," "upper," and the like may be used herein for ease of description to describe one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, that may be illustrated in the accompanying drawings, wherein like reference numerals may refer to the like components throughout.

FIG. 1 is a block diagram of a semiconductor device test handler 600 according to an example embodiment.

Referring to FIG. 1, the semiconductor device test handler 600 may include a loading unit 100, a soak chamber 200, a test chamber 300, a de-soak chamber 400, and/or a sorting/unloading unit 500. The loading unit 100 may be configured to load devices under test (DUTs), such as semiconductor devices, that may be mounted on a tray unit. The tray unit may be a carry/handle unit into which semiconductor devices may be loaded, for example, in a matrix configuration. The tray unit may include a customer tray or trays that may be used to deliver semiconductor devices to a customer, and/or a test tray or trays that may be used only in the semiconductor device test handler 600 to electrically connect semiconductor devices to a tester or testers.

The soak chamber 200 may be configured to receive the test tray or trays from the loading unit 100 and/or to age the received test tray or trays at temperature for a period of time. The soak chamber 200 may be used to test the electrical characteristics of one or more semiconductor devices at high and/or low temperature(s).

The test chamber 300 may be configured to receive the test tray or trays from the soak chamber 200, to connect the received test tray or trays directly or indirectly to the tester or testers, and/or to perform electrical test(s) on the semiconductor devices loaded onto the test tray or trays. In an example embodiment, a chamber structure, a cooling scheme, and/or a contact structure for semiconductor devices may be improved to maintain stable temperature in the test chamber 300. This will be described later with reference to FIG. 2.

The de-soak chamber 400 may be configured to receive the tested semiconductor devices from the test chamber 300 and/or to age the tested semiconductor devices at ambient temperature for a period of time. The ambient temperature may be, for example, room temperature. In an example embodiment, the position of the de-soak chamber 400 also may be modified to minimize temperature change in the test chamber 300 during the delivery of the test tray or trays.

The sorting/unloading unit 500 may sort the tested semiconductor devices into non-defective devices and defective devices according to the results of the electrical test(s) in the test chamber 300, and/or may unload the sorted semiconductor devices from the semiconductor device test handler 600.

Figure 2:
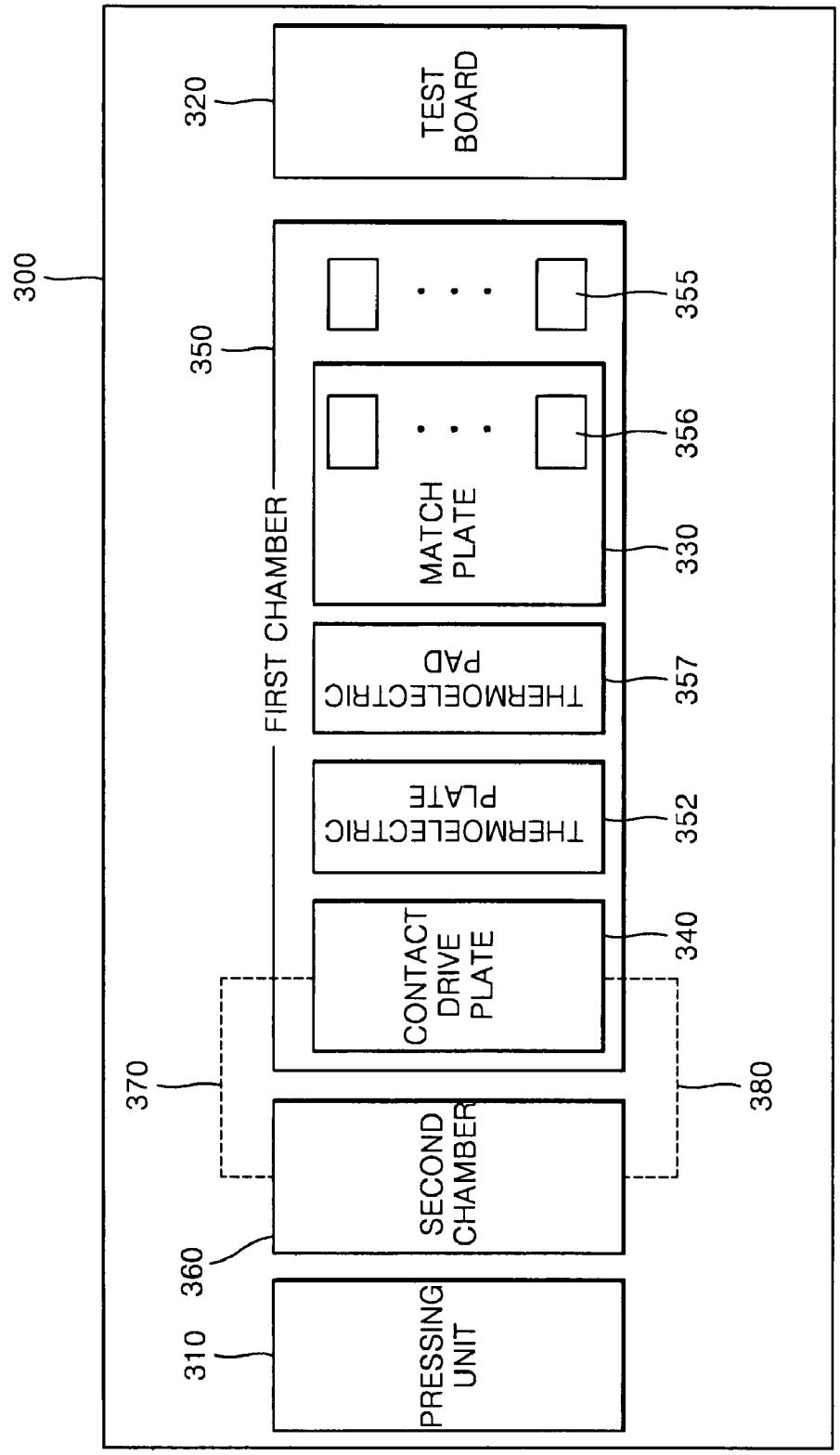
FIG. 2 is a block diagram of a test chamber of the semiconductor device test handler according to an example embodiment.

FIG. 2 is a block diagram of the test chamber 300 of the semiconductor device test handler 600 according to an example embodiment.

Referring to FIG. 2, the test chamber 300 may include at least two pressing units 310 (only one shown in FIG. 2), a first chamber 350, a second chamber 360, and/or a test board 320.

The pressing units 310 may be mechanical structures that are configured to press semiconductor devices in the test tray or trays mounted on the test board 320 in order to electrically connect the semiconductor devices to the test board 320.

The second chamber 360 and/or the first chamber 350 may be disposed near the pressing units 310. The second chamber 360 may contain temperature-control medium, such as liquid coolant (e.g., ethanol).

One or more pipelines may directly or indirectly connect the first and second chambers. The one or more pipelines may allow a temperature-control medium to flow between the first and second chambers. For example, a first pipeline 370 and/or a second pipeline 380 may be installed in and/or between the second chamber 360 and the first chamber 350. The liquid coolant contained in the second chamber 360 may be supplied to the first chamber 350 through the first pipeline 370. The liquid coolant supplied to the first chamber 350 may be returned to the second chamber 360 through the second pipeline 380. When a plurality of semiconductor packages 355 (e.g., 512 or 1024 memory devices) are disposed in the first chamber 350, connected to the test board 320, and tested, a large amount of heat may be generated from the semiconductor packages 355. The first pipeline 370 and the second pipeline 380 may serve to rapidly dissipate the generated heat to the outside.

The dissipation path of the generated heat will now be described. First, heat generated from the semiconductor packages 355 may be transmitted to heat dissipation units 356 included in a match plate 330. For high thermal dissipation efficiency, the heat dissipation units 356 may be formed of one or more highly thermal conductive materials, such as aluminum. The match plate 330 is a housing structure that may bind the heat dissipation units 356 together according to the number of semiconductor packages 355 tested.

Thereafter, the heat transmitted to the heat dissipation units 356 may be transmitted through a thermoelectric pad 357 to a thermoelectric plate 352. The thermoelectric plate 352 may be formed of material capable of exhibiting the Peltier effect. The Peltier effect is the phenomena in which, when an electric current flows through a junction between different metals, the junction is warmed or cooled depending on the direction of the current flow. Metals capable of exhibiting the Peltier effect include, for example, antimony and bismuth.

The heat transmitted to the thermoelectric plate 352 may be transmitted to a contact drive plate 340. The heat transmitted to the contact drive plate 340 may be transmitted to the second chamber 360 by the liquid coolant in the second pipeline 380, and may be finally dissipated into ambient air.

The thermoelectric pad 357 not only may transmit heat, but also may absorb pressure that is applied from the pressing units 310 to the semiconductor packages 355. The thermoelectric pad 357 may be formed, for example, of thermal conductive silicon paste, heatsink grease, and/or thermal conductive compound. Although not illustrated in FIG. 2, the semiconductor packages 355 may be connected by the test tray or trays to the test board 320.

Figure 3:
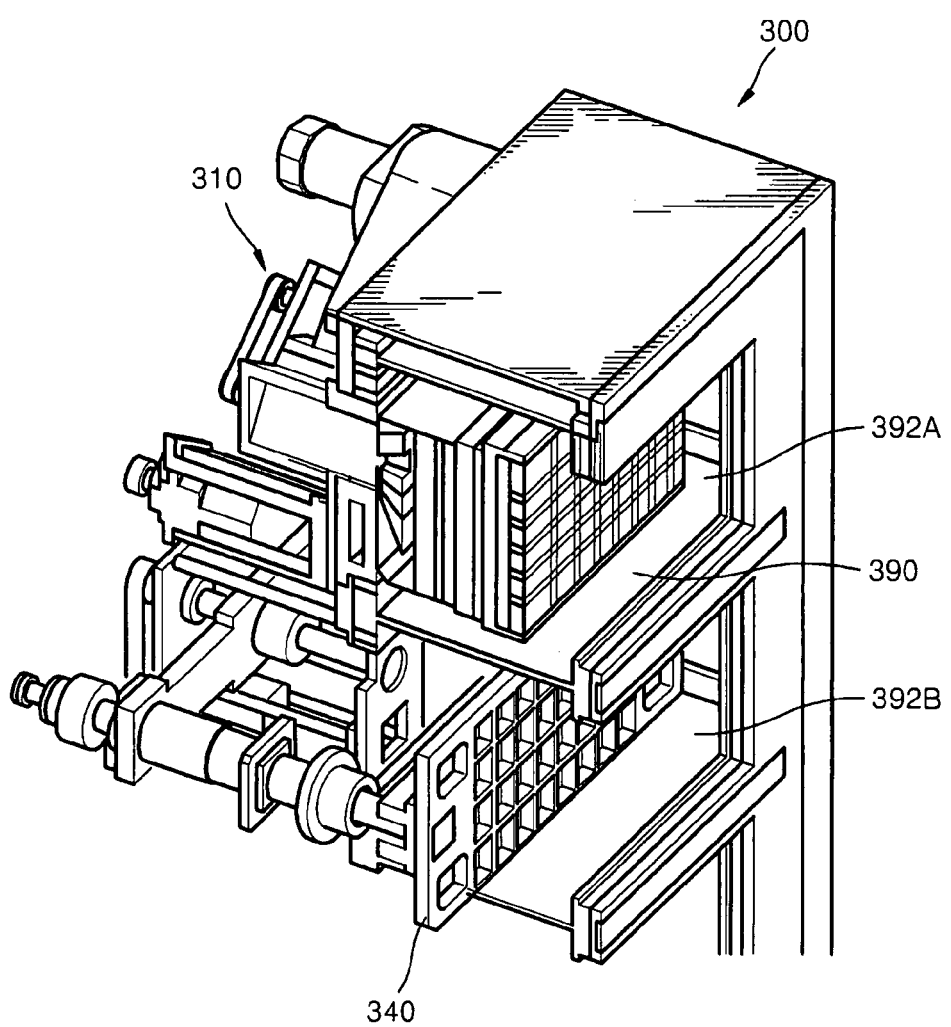
FIG. 3 is a cutaway perspective view illustrating the position of a pressing unit in the test chamber of the semiconductor device test handler according to an example embodiment.

FIG. 3 is a cutaway perspective view illustrating the position of the pressing unit 310 in the test chamber 300 of the semiconductor device test handler 600 according to an example embodiment.

Referring to FIG. 3, at least two pressing units 310 are disposed at the leftmost side, and the second chamber (not illustrated in FIG. 3) is disposed near the pressing units 310. The inside of the first chamber 350 with respect to the contact drive plate 340 may be viewed.

The test chamber 300 may be partitioned by a barrier 390 into two or more test spaces 392A and 392B. The barrier 390 may be formed of one or more thermal insulators. The test space 392A and the test space 392 B may correspond to the first chamber 350 and the second chamber 360, respectively. As the number of DUTs increases, the total processing power necessary for bringing the DUTs into contact with the test board may increase. The barrier 390 may enhance the mechanical durability of the test chamber 300. Also, the barrier 390 may partition a wide chamber space into narrow spaces, thereby reducing temperature variations in the test chamber 300.

Meanwhile, a test tray or trays (not illustrated) is/are loaded into the test spaces 392A and 392B to perform electrical test operations in the test spaces 392A and 392B. Also, temperature compensating operations using thermoelectric plates and liquid coolants may be performed independently in the first chamber 350 and the second chamber 360, corresponding to the test spaces 392A and 392B, respectively. In each of the test spaces 392A and 392B, at least two pressing units 310 may be installed to stably bring the DUTs into contact with the test board 320. Accordingly, even when the number of the DUTs may increase to 256, 516, or 1024, or the DUTs may be high-speed memory devices that are self-heated during the electrical test operations, the test chamber 300 may uniformly maintain its internal temperature substantially over its entire internal space using, for example, the water-cooled temperature control operations of the first chamber 350 and the second chamber 360.

Figure 4:
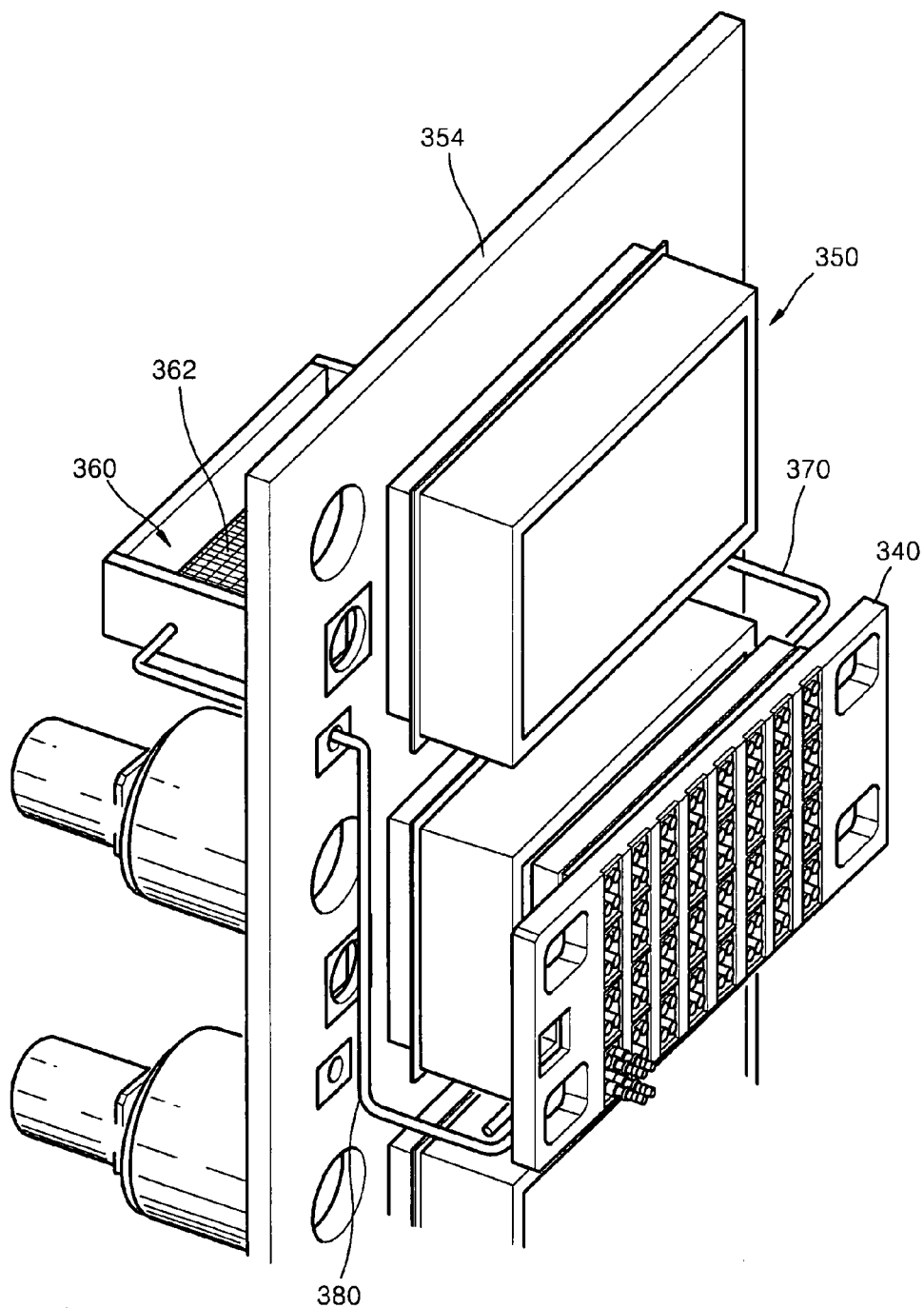
FIG. 4 is a perspective view illustrating the structures of a first chamber and a second chamber in the semiconductor device test handler according to an example embodiment.

FIG. 4 is a perspective view illustrating the structures of first chamber 350 and second chamber 360 in the semiconductor device test handler 600 according to an example embodiment.

Referring to FIG. 4, from the leftmost side, the second chamber 360, a first chamber sidewall 354, the first chamber 350, and/or the contact drive plate 340 may be sequentially disposed next to one another. In FIG. 4, a portion of the second chamber 360 is cut away in order to view the internal structure thereof.

Although not illustrated in FIG. 4, the thermoelectric plate 352 may be disposed at the rear of the contact drive plate 340. The thermoelectric plate 352 may be formed of material capable of exhibiting the Peltier effect.

Accordingly, an airflow due to an air-cooled operation may occur in the test space of the test chamber 300 where the DUTs are tested. In addition, the thermoelectric plate 352 may be separately installed next to the portions at which the self-heating operations of the semiconductor devices may occur. Accordingly, when the semiconductor devices are tested in parallel, the thermoelectric plate 352 may absorb, by the Peltier effect, heat that is generated during the electrical test operations. The absorbed heat may be dissipated to the outside of the test space through the first pipeline 370 and the second pipeline 380, that may be installed in and/or between the first chamber 350 and the second chamber 360. For efficient heat dissipation to the outside of the test space, a separate heatsink plate 362 may be installed in the second chamber 360. The separate heatsink plate 362 may contain, for example, liquid coolant.

Figure 5:
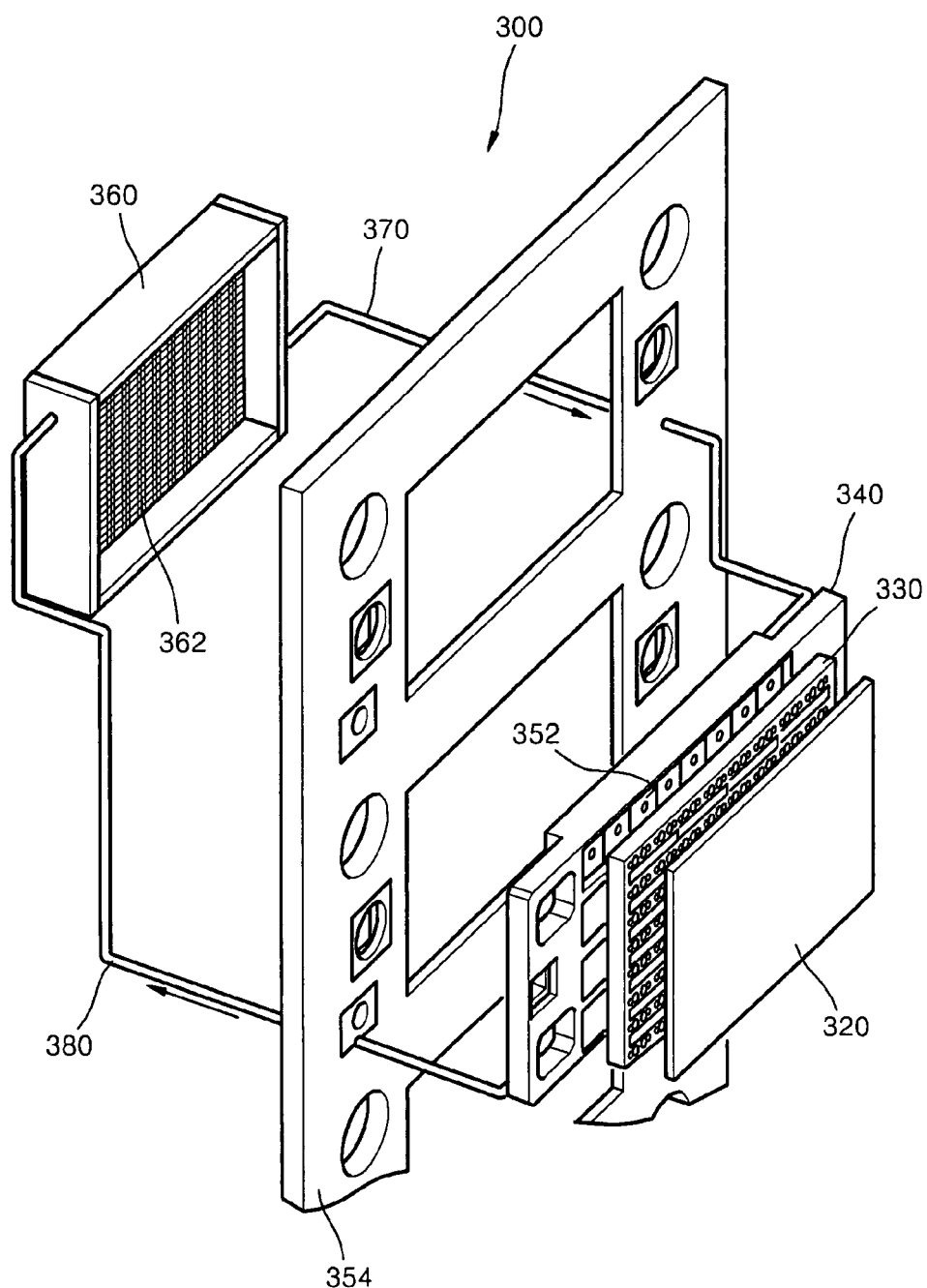
FIG. 5 is an exploded perspective view illustrating the structure of a pipeline unit of the test chamber in the semiconductor device test handler according to an example embodiment.

FIG. 5 is an exploded perspective view illustrating the structure of a pipeline unit of the test chamber 300 in the semiconductor device test handler 600 according to an example embodiment.

Referring to FIG. 5, the pipeline unit may be divided into the first pipeline 370 and the second pipeline 380. The first pipeline 370 may be used to supply liquid coolant in the second chamber 360 to the contact drive plate 340 in the first chamber 350, and/or the second pipeline 380 may be used to recover the liquid coolant supplied to the contact drive plate 340 in the first chamber 350. In FIG. 5, reference numeral "354" denotes the first chamber sidewall, and the test board 320 may be mounted on the match plate 330.

The flow of the liquid coolant through the first pipeline 370 and/or the second pipeline 380 between the first chamber 350 and/or the second chamber 360 may be generated by natural convection of the liquid coolant due to temperature difference. If necessary, a circulation pump or equivalent may be additionally installed to forcibly circulate the liquid coolant. In an example embodiment, the heatsink plate 362 may be installed in the second chamber 360 to induce the natural convection of the liquid coolant. The liquid coolant may be ethanol or include ethanol, but other liquid coolants also may be used, alone or in combination.

The heatsink plate 362 may be formed by a three-dimensional structure of pins, for example, so that its contact area with air is increased to rapidly cool the liquid coolant. The heatsink plate 362 also may be modified by those skilled in the art. The heatsink plate 362 may be disposed on the side, rear, or bottom surface of the second chamber 360, but it also may be disposed in other places relative to the second chamber 360. Although the heatsink plate 362 is illustrated as being cooled by air, it also may be cooled by cold water, cold liquid nitrogen, and/or other cooling agent(s).

Accordingly, when heat is generated by the DUTs during the electrical test operations in the test chamber 300, the internal temperature of the test chamber 300 may be first controlled by air circulation in the test space. Thereafter, the internal temperature may be further controlled by the Peltier effect of the thermoelectric plate 352 disposed near the test board 320. Finally, the internal temperature may be yet further controlled by the liquid coolant that flows through the first pipeline 370 and/or the second pipeline 380 that may be connected to the first chamber 350 and/or the second chamber 360.

Thus, heat may be rapidly dissipated outside the portioned test spaces of the test chamber 300, thereby making it possible to realize a stable test environment having a constant or substantially constant test temperature. This method of controlling the temperature of the test chamber 300 may be more efficient for a handler to test 512 or more semiconductor memory devices in parallel.

Figure 6:
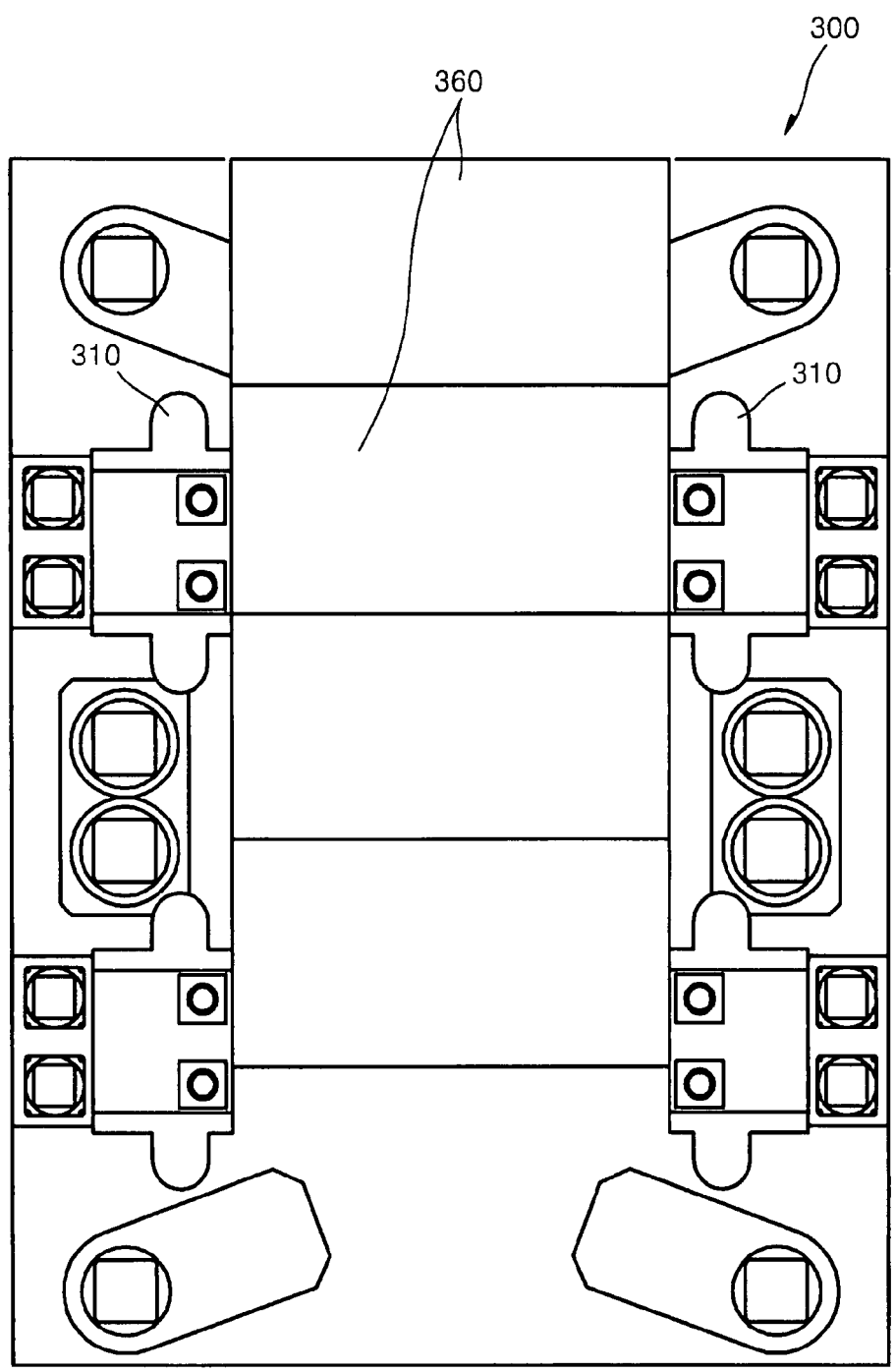
FIG. 6 is a rear view illustrating the structure of the second chamber in the semiconductor device test handler according to an example embodiment.

FIG. 6 is a rear view illustrating the structure of the second chamber 360 in the semiconductor device test handler 600 according to an example embodiment.

Referring to FIG. 6, the test chamber 300 according to an example embodiment may include two or more spaces into which the test tray or trays are loaded to perform the electrical test operations on the DUTs. In an example embodiment, as illustrated in FIG. 6, the test chamber 300 may be partitioned into four test spaces by barriers formed by one or more thermal insulators. The temperature in each of the partitioned test spaces may be controlled, for example, by the liquid coolant that flows through the first chamber (350 in FIG. 2) and the second chamber (360 in FIG. 3). Reference numeral "310" denotes the pressing units that are installed at the rear of the second chamber (360 in FIG. 3) to press the semiconductor packages.

Figure 7:
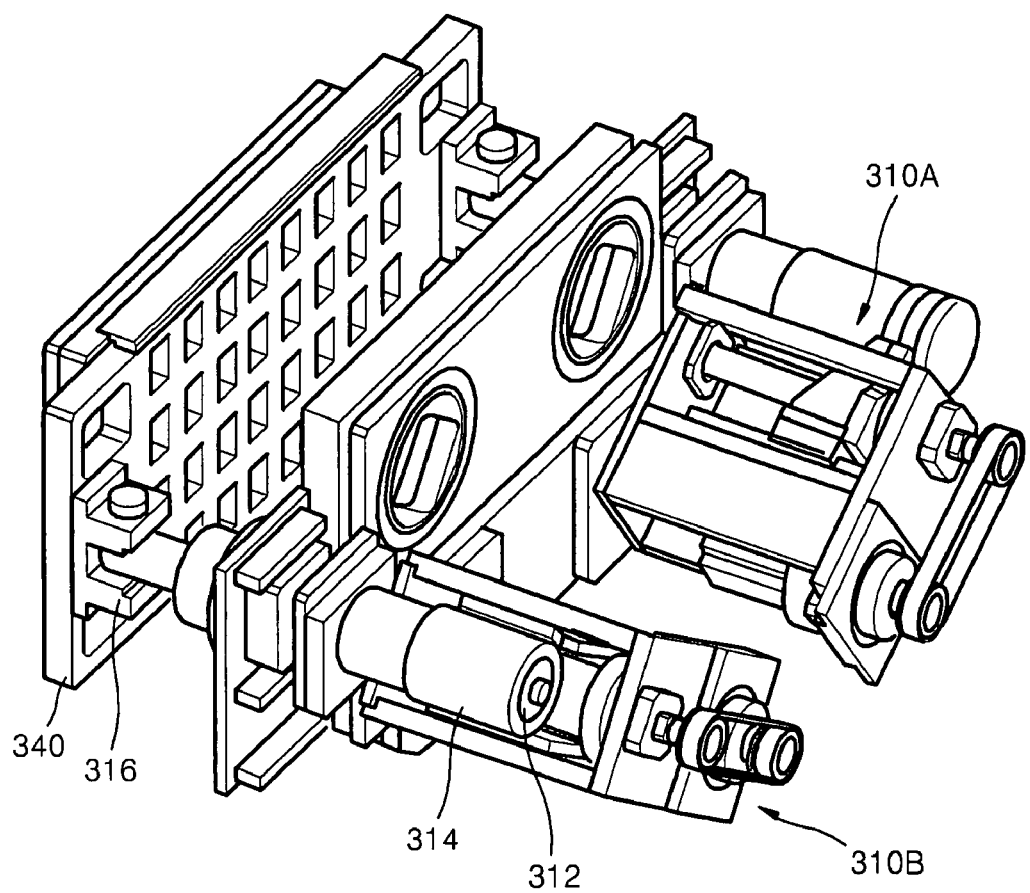
FIG. 7 is a perspective view illustrating the structure of the pressing units in the semiconductor device test handler according to an example embodiment.

FIG. 7 is a perspective view illustrating the structure of the pressing units 310 in the semiconductor device test handler 600 according to an example embodiment.

Referring to FIG. 7, two pressing units 310A and 310B may be used in an example embodiment. Compared to using only one pressing unit, using the two pressing units 310A and 310B may more stably bring the DUTs into contact with a socket (not illustrated) of the test board 320. The pressing unit 310B may be protected by a thermal insulator 314 to prevent it from being affected by high temperature. A measuring unit 312 for measuring the sum of forces applied from the pressing units 310A and 310B additionally may be provided in the pressing unit 310B. In FIG. 7, reference numeral "316" denotes a pressing shaft connecting unit that may be operatively connected to contact drive plate 340.

Figure 8:
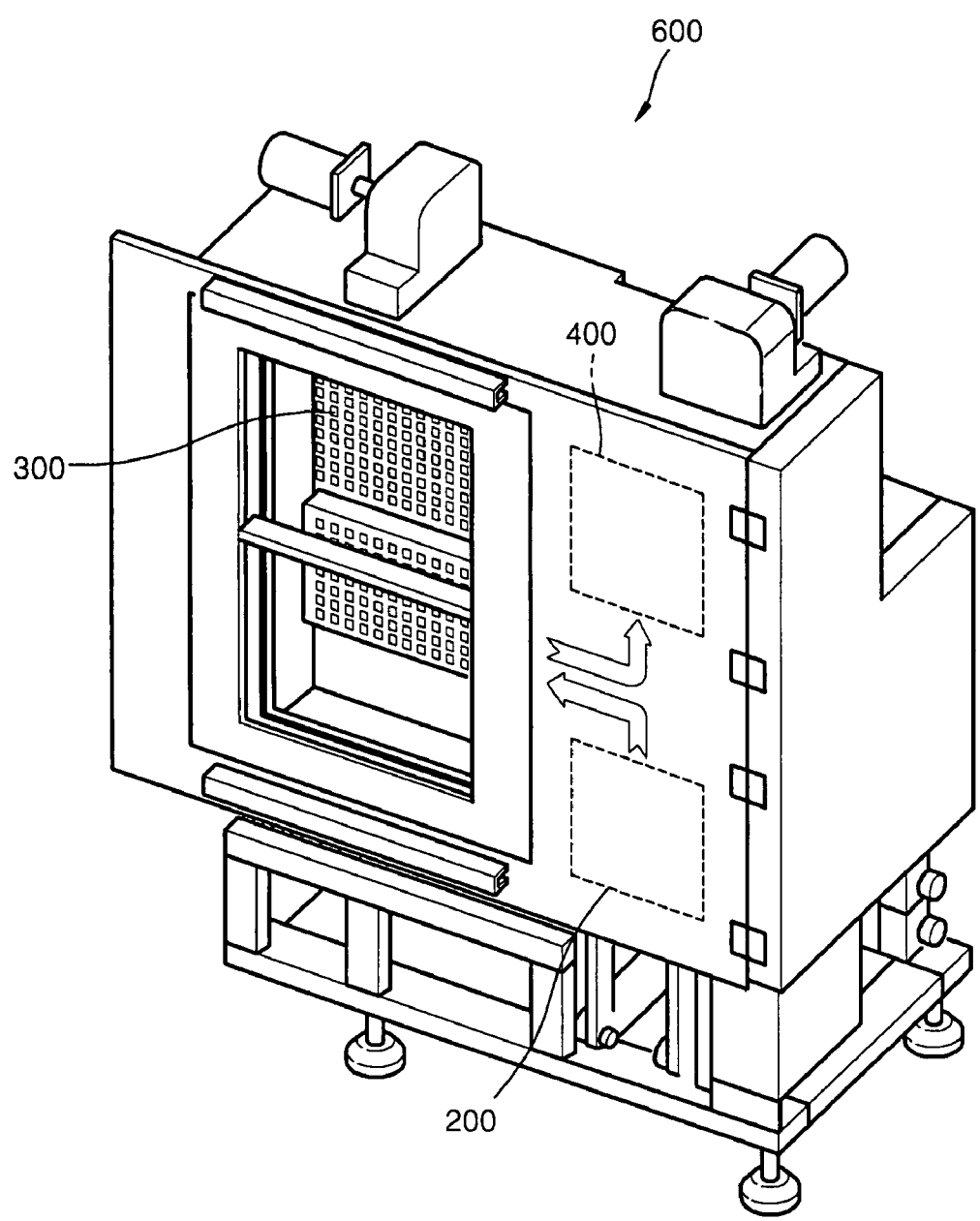
FIG. 8 is a perspective view illustrating the positions of a soak chamber and a de-soak chamber relative to the position of the test chamber in the semiconductor device test handler according to an example embodiment.

FIG. 8 is a perspective view illustrating the positions of the soak chamber 200 and the de-soak chamber 400 relative to the position of the test chamber 300 in the semiconductor device test handler 600 according to an example embodiment.

Referring to FIG. 8, in the semiconductor device test handler 600 according to an example embodiment, with respect to the test chamber 300, the de-soak chamber 400 may be installed in the same direction as the installation direction of the soak chamber 200. That is, the de-soak chamber 400 may be installed above the soak chamber 200. However, the installation positions of the de-soak chamber 400 and the soak chamber 200 may be interchanged so that, for example, the de-soak chamber 400 is installed below the soak chamber 200. Additionally, other arrangements of the position of the soak chamber 200 relative to the position of the de-soak chamber 400 are possible.

When the electrical test operations on the DUTs mounted on the test tray or trays in the test chamber are completed, the test tray or test trays may be ejected in the same direction as an initial loading direction (indicated by arrows in FIG. 8). Accordingly, it may be possible to minimize temperature variation in the test chamber 300 caused by the de-soak chamber 400 that may be opened when the test tray or trays containing the tested DUTs may be ejected. Also, it may be possible to further reduce the size of the test chamber 300.

As described above, the example embodiments may partition the test chamber into a plurality of test spaces using one or more barriers, may install the thermoelectric plate and the second chamber for temperature control in each of the partitioned test spaces, and/or may perform temperature control operation on the test chamber using the liquid coolant flowing through the first and second pipelines, thereby reducing temperature variation in the test chamber. Accordingly, even when the number of DUTs increases or the DUTs are heat-generating devices operating at high speed, degradation in a test yield due to temperature variation may be prevented.

Also, at least two pressing units may be installed in each of the partitioned spaces of the test chamber. Accordingly, even when the number of the DUTs increases, stable contact between the DUT and the tester may be achieved. Consequently, it may be possible to prevent degradation in a test yield due to a variation in contact forces at the DUTs.

While example embodiments have been particularly shown and described, it will be understood by those of ordinary skill in the art that various changes in form and details may be made therein without departing from the spirit and scope of the present invention as defined by the following claims.

What is claimed is:

1. A semiconductor device test handler for maintaining a stable temperature or temperatures in a test environment, the handler comprising:
    a loading unit that loads a plurality of semiconductor devices mounted on a test tray or trays;
    a soak chamber configured to receive the test tray or trays from the loading unit and to age the semiconductor devices at an aging temperature or temperatures; and
    a test chamber configured to receive and test the aged semiconductor devices, the test chamber comprising:
        a test board;
        a first chamber disposed near the test board;
        a second chamber disposed near the first chamber;
        one or more pipelines directly or indirectly connected to the first and second chambers that allow a temperature-control medium to flow between the first and second chambers;
        a de-soak chamber that further ages the tested semiconductor devices so that the tested semiconductor devices substantially return to ambient temperature; and
        a sorting and unloading unit that sorts the tested semiconductor devices according to results of the test and that unloads the sorted semiconductor devices;
    wherein the temperature-control medium comprises liquid coolant.

2. The handler of claim 1, wherein the test chamber further comprises a pressing unit configured to press the semiconductor devices in order to electrically connect the semiconductor devices to the test board.

3. The handler of claim 2, wherein the test chamber comprises two or more pressing units.

4. The handler of claim 3, wherein the two or more pressing units comprise a measuring unit that measures a sum of forces applied by the two or more pressing units.

5. The handler of claim 2, wherein the test chamber comprises at least one pair of pressing units.

6. The handler of claim 1, wherein the one or more pipelines comprise:
    a first pipeline that supplies the temperature-control medium from the second chamber to a contact drive plate near the first chamber; and
    a second pipeline that returns the temperature-control medium from the contact drive plate to the second chamber.

7. The handler of claim 6, wherein a flow of the temperature-control medium through the first and second pipelines is generated by a temperature difference in the temperature-control medium.

8. The handler of claim 1, wherein the test chamber comprises at least two test spaces where the semiconductor devices are tested on the test tray or trays.

9. The handler of claim 8, wherein the at least two test spaces are created by one or more barriers formed of one or more thermal insulators.

10. The handler of claim 1, wherein the de-soak chamber is disposed above the soak chamber.

11. The handler of claim 1, wherein the de-soak chamber is disposed below the soak chamber.

12. The handler of claim 1, wherein the liquid coolant comprises ethanol.

13. The handler of claim 2, wherein the first chamber comprises:
    a contact drive plate pressed by the pressing unit;
    a thermoelectric plate disposed near the contact drive plate;
    a thermoelectric pad disposed near the thermoelectric plate;
    a match plate disposed near the thermoelectric pad; and
    semiconductor packages mounted on the test board;
    wherein the match plate comprises a plurality of heat dissipation units, and
    wherein the semiconductor packages contact the heat dissipation units.

14. The handler of claim 13, wherein the thermoelectric plate is formed of material exhibiting the Peltier effect.

15. The handler of claim 13, wherein the thermoelectric pad is formed of material that has high thermal conductivity and that absorbs contact pressure generated when the semiconductor packages are brought into contact with the heat dissipation units.

16. The handler of claim 13, wherein the thermoelectric pad is formed of one or more of thermal conductive silicon paste, heatsink grease, and thermal conductive compound.

17. The handler of claim 13, wherein the heat dissipation units are formed of one or more metals with high thermal dissipation efficiency.

18. The handler of claim 17, wherein the one or more metals comprise aluminum.

19. The handler of claim 1, wherein the second chamber comprises a heat sink that dissipates heat to an outside environment.

20. A semiconductor device test handler for maintaining a stable temperature or temperatures in a test environment, the handler comprising:
    a loading unit that loads a plurality of semiconductor devices mounted on a test tray or trays;

a soak chamber configured to receive the test tray or trays from the loading unit and to age the semiconductor devices at an aging temperature or temperatures;

a test chamber configured to receive and test the aged semiconductor devices, the test chamber comprising:
two or more test spaces partitioned by one or more barriers, each of the partitioned test spaces comprising two or more pressing units;

a de-soak chamber that further ages the tested semiconductor devices so that the tested semiconductor devices substantially return to ambient temperature; and a sorting and unloading unit that sorts the tested semiconductor devices according to results of the test and that unloads the sorted semiconductor devices;

wherein the test chamber further comprises:
a second chamber through which liquid coolant flows;
a first chamber disposed higher than the second chamber, connected through first and second pipelines to the second chamber, and comprising a contact drive plate, a thermoelectric plate, a thermoelectric pad, and a match plate;
a test board disposed near the first chamber; and
a pressing unit disposed near the second chamber to press semiconductor devices mounted on the test board.

21. The handler of claim 20, wherein the liquid coolant comprises ethanol.

22. The handler of claim 20, wherein the thermoelectric plate in the first chamber is formed of material exhibiting the Peltier effect.

23. The handler of claim 20, wherein the test chamber is a space where semiconductor devices are tested in parallel.

24. The handler of claim 20, wherein the second chamber comprises a heat dissipation unit cooling the liquid coolant.

* * * * *